United States Patent [19]
Yoo et al.

[11] Patent Number: 5,840,604
[45] Date of Patent: Nov. 24, 1998

[54] METHODS OF FORMING MOS TRANSISTORS HAVING HOT-CARRIER SUPPRESSION ELECTRODES

[75] Inventors: Ji-Hyoung Yoo, Kyungki-do; Gwang-Hyeon Lim, Inch'eon, both of Rep. of Korea

[73] Assignee: Samsung Electronics Co., Ltd., Suwon, Rep. of Korea

[21] Appl. No.: 764,314

[22] Filed: Dec. 12, 1996

[30] Foreign Application Priority Data

Dec. 28, 1995 [KR] Rep. of Korea .................. 1995-61309

[51] Int. Cl.$^6$ ...................... H01L 21/8238; H01L 21/336
[52] U.S. Cl. .......................... 438/230; 438/300; 438/305; 438/233
[58] Field of Search ..................................... 438/230, 299, 438/300, 301, 303, 305, 306, 307, 268, 269, 275, 277, 279, 532, 233

[56] References Cited

U.S. PATENT DOCUMENTS

| | | | |
|---|---|---|---|
| 4,380,863 | 4/1983 | Rao .......................................... | 438/279 |
| 4,391,032 | 7/1983 | Schulte .................................... | 438/532 |
| 4,505,027 | 3/1985 | Schwabe et al. ....................... | 438/291 |
| 4,642,881 | 2/1987 | Matsukawa et al. ................... | 438/291 |
| 4,679,302 | 7/1987 | Theriault et al. ........................ | 438/532 |
| 5,413,948 | 5/1995 | Pfiester et al. ........................... | 438/279 |

OTHER PUBLICATIONS

Huang et al., *A New LDD Transistor With Inverse–T Gate Structure*, IEEE Electron Device Letters, vol. EDL–8, No. 4, Apr. 1987, pp. 151–153.

Izawa et al., *Impact Of The Gate–Drain Overlapped Device (GOLD) For Deep Submicrometer VLSI*, IEEE Transactions on Electron Devices, vol. 35, No. 12, Dec. 1988, pp. 2088–2093.

*Primary Examiner*—Michael Trinh
*Attorney, Agent, or Firm*—Myers Bigel Sibley & Sajovec

[57] ABSTRACT

Methods of forming MOS transistors include the steps of forming hot-carrier suppression electrodes on opposing sides of an insulatedgate of a field effect transistor, to reduce hot-carrier degradation parasitics and reduce gate-to-drain overlap capacitance ($C_{gd}$). These methods include the steps of forming at least a first hot-carrier suppression electrode between a drain electrode and an insulated gate electrode of a field effect transistor. The hot-carrier suppression electrode reduces the likelihood of hot-carrier degradation parasitics by inhibiting hot electron injection into the gate oxide of the field effect transistor and also reduces the gate-to-drain region capacitance by eliminating the need to establish a fully-overlapped geometry between the transistor's gate and lightly doped drain (LDD) region extension as a way to prevent parasitic injection. According to a preferred embodiment of the present invention, a first electrically insulating layer (e.g., $SiO_2$) is initially formed on a face of a semiconductor substrate containing a region of first conductivity type (e.g., P-well, N-well) therein extending to the face. A first conductive layer (e.g., polysilicon) is also formed on the first electrically insulating layer, opposite the region of first conductivity type. The first conductive layer is then patterned to define first and second hot-carrier suppression electrodes having opposing sidewalls. These sidewalls are then oxidized and then a gate electrode is formed between the oxidized sidewalls. Source and drain regions of second conductivity type are then formed in the region of first conductivity type, opposite the first and second hot-carrier suppression electrodes, and then source and drain contacts are patterned to electrically contact the first and second hot-carrier suppression electrodes, respectively.

20 Claims, 6 Drawing Sheets

METHODS OF FORMING MOS TRANSISTORS HAVING HOT-CARRIER SUPPRESSION ELECTRODES

FIELD OF THE INVENTION

The present invention relates to semiconductor devices and fabrication methods, and more particularly to methods of forming metal-oxide-semiconductor (MOS) devices and devices formed thereby.

BACKGROUND OF THE INVENTION

Conventional attempts to minimize the size of MOSFETs to achieve higher integration densities and lower power consumption requirements, for example, have been restricted by hot-carrier degradation of device lifetime. In particular, for MOSFETs having submicron channel lengths, hot-carrier degradation can lead to increases in threshold voltage ($V_{th}$) and decreases in drain saturation current ($I_{ds}$). To make MOSFETs less susceptible to hot-carrier degradation, modified drain geometries like the lightly doped drain (LDD) extensions which attempt to reduce carrier heating by lowering the lateral electric field in the channel region or the buried-drain structures that attempt to keep hot carriers away from the gate oxide by subsurface collection, have been attempted. Such attempts are more fully described in articles by R. Izawa et al. entitled *Impact of the Gate-Overlapped Device (GOLD) for Deep Submicrometer VLSI*, IEEE Trans. Elec. Dev., ED-35 (12), 2088 (1988); and T. Huang et al. entitled *A New LDD Transistor with Inverse-T Gate Structure*, IEEE Elec. Dev. Lett., EDL-8 (4), 151 (1987). However, if the length of the overlap between a gate electrode and a lightly doped drain (LDD) extension of a MOSFET is not carefully controlled, a substantial increase in parasitic gate-to-drain capacitance can occur, thereby resulting in a reduction in the operating speed of the MOSFET.

Thus, notwithstanding the above-described attempts to reduce hot-carrier degradation in MOSFETs, there continues to be a need for improved methods of forming MOSFETs with reduced hot-carrier degradation parasitics and reduced parasitic gate-to-drain capacitance.

SUMMARY OF THE INVENTION

It is therefore an object of the present invention to provide improved methods of forming integrated circuit semiconductor devices, and devices formed thereby.

It is another object of the present invention to provide improved methods of forming CMOS semiconductor devices, and devices formed thereby.

It is a further object of the present invention to provide methods of forming CMOS semiconductor devices which have reduced susceptibility to hot electron injection parasitics, and devices formed thereby.

It is still a further object of the present invention to provide methods of forming CMOS semiconductor devices having reduced gate-to-drain capacitance and reduced gate-to-source capacitance, and devices formed thereby.

These and other objects, features and advantages of the present invention are provided by methods which include the steps of forming hot-carrier suppression electrodes on opposing sides of an insulated-gate of a field effect transistor, to reduce hot-carrier degradation parasitics and reduce gate-to-drain overlap capacitance ($C_{gd}$). In particular, these methods include the steps of forming at least a first hot-carrier suppression electrode between a drain electrode and an insulated gate electrode of a field effect transistor. The hot-carrier suppression electrode reduces the likelihood of hot-carrier degradation parasitics by inhibiting hot electron injection into the gate oxide of the field effect transistor and also reduces the gate-to-drain region capacitance by eliminating the need to establish a fully-overlapped geometry between the transistor's gate and lightly doped drain (LDD) region extension as a means to prevent parasitic injection.

According to a preferred embodiment of the present invention, a first electrically insulating layer (e.g., $SiO_2$) is initially formed on a face of a semiconductor substrate containing a region of first conductivity type (e.g., P-well, N-well) therein extending to the face. A first conductive layer (e.g., polysilicon) is also formed on the first electrically insulating layer, opposite the region of first conductivity type. The first conductive layer is then patterned to define first and second hot-carrier suppression electrodes having opposing sidewalls. These sidewalls are then oxidized and then a gate electrode is formed between the oxidized sidewalls. Source and drain regions of second conductivity type are then formed in the region of first conductivity type, opposite the first and second hot-carrier suppression electrodes, and then source and drain contacts are patterned to electrically contact the first and second hot-carrier suppression electrodes, respectively.

Here, the patterning step is preferably performed to expose a portion of the first electrically insulating layer extending between the first and second hot-carrier suppression electrodes and the oxidizing step is preceded by the step of removing the exposed portion of the first electrically insulating layer to expose the region of first conductivity type at the face. Preferably, the oxidizing step comprises oxidizing the exposed region of first conductivity type at a first growth rate, to form an oxide having a thickness in a range between about 150–200 Å, and oxidizing the sidewalls of the first and second hot-carrier suppression electrodes at a second growth rate greater than the first growth rate, to form an oxide spacer having a thickness greater than 200 Å.

The source and drain regions are also preferably formed to contain lightly doped source (LDS) and lightly doped drain (LDD) extensions by (i) implanting dopants of second conductivity type through the first and second hot-carrier suppression electrodes, using the insulated gate electrode as a mask, (ii) forming electrically insulating spacers on sidewalls of the gate electrode; and then (iii) implanting dopants of second conductivity type through the first and second hot-carrier suppression electrodes again, using the insulated gate electrode and insulating spacers as an implant mask.

The present invention also includes metal-oxide-semiconductor field effect transistors (MOSFETs) having at least one hot-carrier suppression electrode disposed between the transistor's drain and insulated gate electrodes. The hot-carrier suppression electrode inhibits hot electron injection into the oxide surrounding the gate electrode by suppressing the generation of high electric fields at the drain side of the transistor's channel region. Preferably, the suppression electrode is patterned to overlap the lightly doped drain (LDD) extension of the drain region and is separated from the gate electrode by an oxide spacer having a thickness greater than the thickness of the gate oxide. The suppression electrode is also preferably doped with the same dopants as the source and drain regions by forming the suppression electrode first and then implanting the drain region dopants through the suppression electrode into the substrate.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as P or N-type, however, each embodiment described and illustrated herein includes its complementary embodiment as well.

Figure 1:
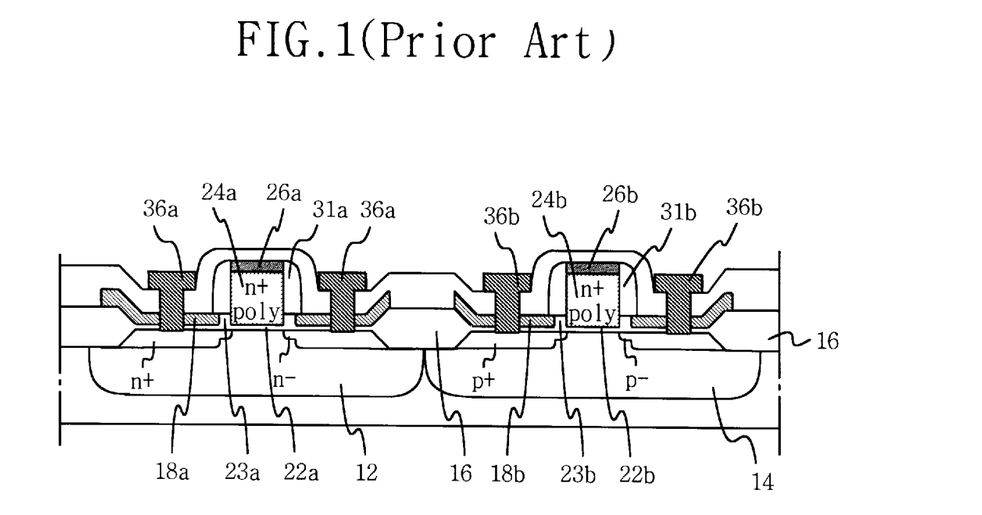
FIG. 1 illustrates a schematic cross-sectional view of a CMOS semiconductor device according to an embodiment of the present invention.

Referring now to FIGS. 1–11, preferred methods of forming an insulated-gate field effect transistor according to the present invention will now be described. In particular, FIG. 1 illustrates a schematic cross-sectional view of a CMOS semiconductor device containing both NMOS and PMOS transistors with N-type and P-type hot-carrier suppression electrodes 18a and 18b, respectively, formed in accordance with the present invention. The NMOS transistor is formed in a P-type well region 12 which extends to a face of a semiconductor substrate, at an opening in a field oxide isolation region 16. The source and drain region of the NMOS transistor are contacted at the face by source and drain electrodes 36a and include light doped source and drain extensions (shown as N−). An N+ polysilicon gate 24a is also provided on a gate oxide insulating layer 22a, opposite a P-type channel region which is defined by the space between the N-type source and drain regions. A pair of N-type hot-carrier suppression electrodes 18a are also provided on opposite sides of the gate 24a which contains a silicide capping layer 26a. The suppression electrodes 18a are separated from the N-type gate 24a by lower sidewall spacers 23a which preferably have a thickness greater than the thickness of the gate oxide insulating layer 22a.

As illustrated, the suppression electrodes 18a are separated from the face and the N-type source and drain regions by an oxide layer, but ohmically contact the source and drain electrodes 36a above the face. Upper sidewall spacers 31a are also provided for insulating the N-type gate 24a. The hot-carrier suppression electrodes 18a reduce the likelihood of hot-carrier degradation parasitics by inhibiting hot electron injection into the gate oxide (and sidewall spacers) of the NMOS transistor. As determined by the inventors herein, the hot-carrier suppression electrodes 18a inhibit hot electron injection into the oxide surrounding the gate electrode 24a by suppressing the generation of high electric fields at the drain side (and source side) of the NMOS transistor's channel region. Accordingly, the need to establish a fully-overlapped geometry between the NMOS transistor's gate 24a and the lightly doped drain (LDD) region extension as a conventional means to prevent parasitic injection, is reduced. Thus, LDD geometries which do not full overlap the transistor's gate can be used which means that reduced parasitic gate-to-drain capacitance ($C_{gd}$) can be achieved.

Similarly, the PMOS transistor is formed in a N-type well region 14 which extends to a face of a semiconductor substrate, at an opening in a field oxide isolation region 16. The source and drain region of the PMOS transistor are contacted at the face by source and drain electrodes 36b and include light doped source and drain extensions (shown as P−). An N+ polysilicon gate 24b is also provided on a gate oxide insulating layer 22b, opposite an N-type channel region which is defined by the space between the P-type source and drain regions. A pair of P-type hot-carrier suppression electrodes 18b are also provided on opposite sides of the gate 24b which contains a silicide capping layer 26b. The suppression electrodes 18b are separated from the N-type gate 24b by lower sidewall spacers 23b which preferably have a thickness greater than the thickness of the gate oxide insulating layer 22b. As illustrated, the P-type suppression electrodes 18b are separated from the face and the P-type source and drain regions by an oxide layer, but ohmically contact the source and drain electrodes 36b above the face. Upper sidewall spacers 31b are also provided for insulating the N-type gate 24b.

Figure 2:
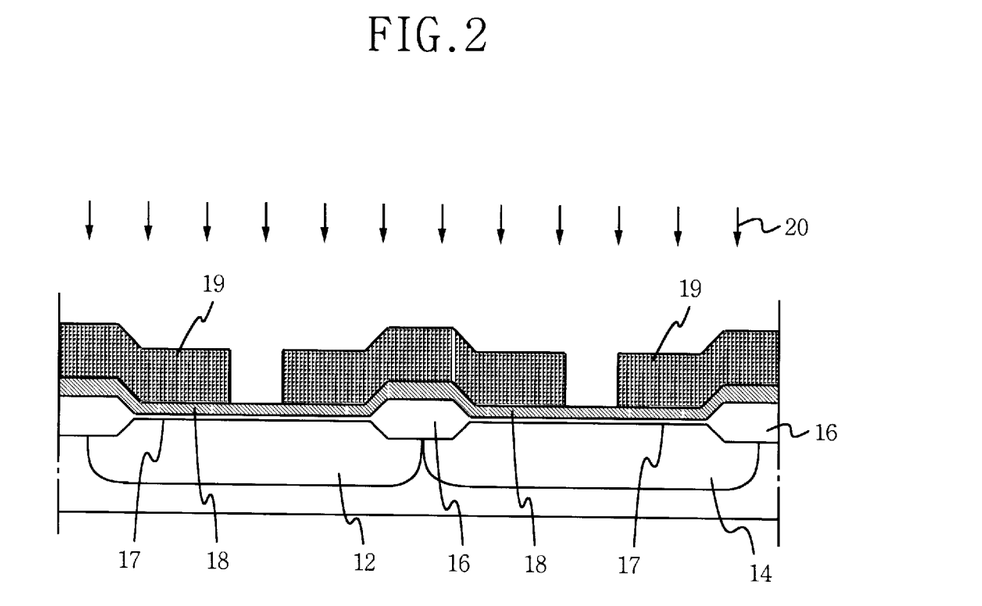
FIGS. 2–11 illustrate schematic cross-sectional views of intermediate structures which describe a method of forming a CMOS semiconductor device according to an embodiment of the present invention.

As illustrated best by FIG. 2, methods of forming the CMOS device of FIG. 1 may include the steps of forming P-type and N-type well regions 12 and 14 at a face of a semiconductor substrate of predetermined conductivity type. As will be understood by those skilled in the art, the steps of forming the well regions 12 and 14 may be preceded by the step of forming a field oxide isolation region 16 using a local oxidation of silicon (LOCOS) process to define a pair of adjacent active regions. Using respective masks, P-type and N-type dopants may then be implanted into the face of the substrate and then diffused to define the P-type and N-type well regions 12 and 14. A first electrically insulating region 17 is then formed on the active regions. Here, for example, the portions of the face of the semiconductor substrate exposed by the field oxide isolation region 16 may be thermally oxidized to form a thin oxide layer having a thickness in a range between about 150–200 Å. A first conductive layer 18 is then formed on the first electrically insulating layer 17. According to a preferred aspect of the present invention, the first conductive layer 18 is formed by depositing an layer of intrinsic polycrystalline silicon (polysilicon) having a thickness in a range between about 400–500 Å. Next, a second electrically insulating layer 19 is formed on the first conductive layer 18. The second electrically insulating layer 19 may comprise a deposited layer of silicon nitride ($Si_3N_4$) having a thickness in a range between about 4000–5000 Å. The second electrically insulating layer 19 is then patterned to expose portions of the first conductive layer 18 where the gate electrodes for the NMOS and PMOS transistors are to be subsequently formed. The second electrically insulating layer 19 may be patterned using a mask (not shown) and a selective etchant which etches silicon nitride but not polysilicon. Threshold voltage adjust dopants 20 of predetermined conductivity type may then be implanted into the channel regions of the NMOS and PMOS transistors.

Figure 3:
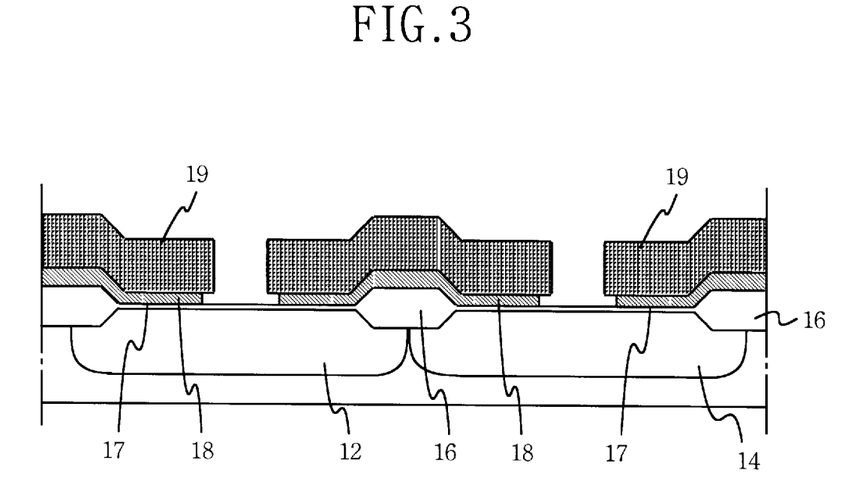
Figure 4:
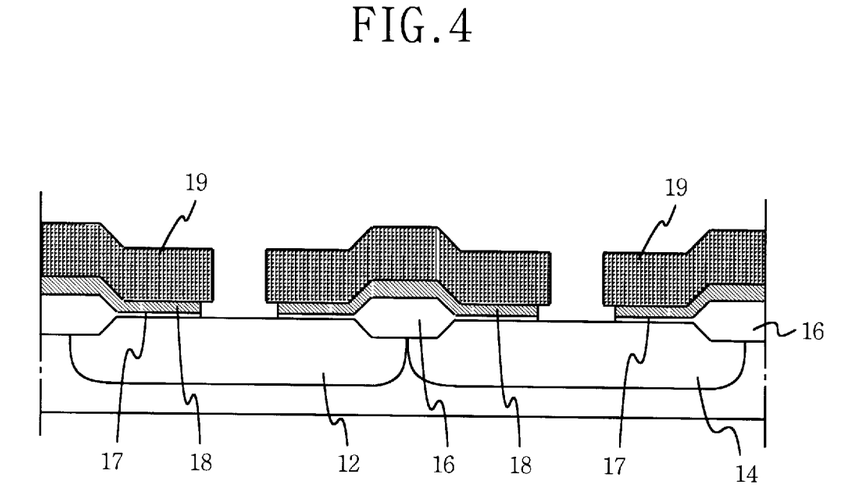

Referring now to FIGS. 3–4, after the second electrically insulating layer 19 has been patterned, a step is performed to isotropically etch the exposed portions of the first conductive layer 18 until the first electrically insulating layer 17 is exposed. Because isotropic etching preferably takes place in both the vertical and horizontal directions, the sidewalls of the patterned second electrically insulating layer 19 will typically be undercut by about the thickness of the first conductive layer 18 (i.e., 400–500 Å). As best illustrated by FIG. 4, the exposed portions of the first electrically insulating layer 17 are then selectively etched using the patterned first conductive layer 18 as an etching mask.

Figure 5:
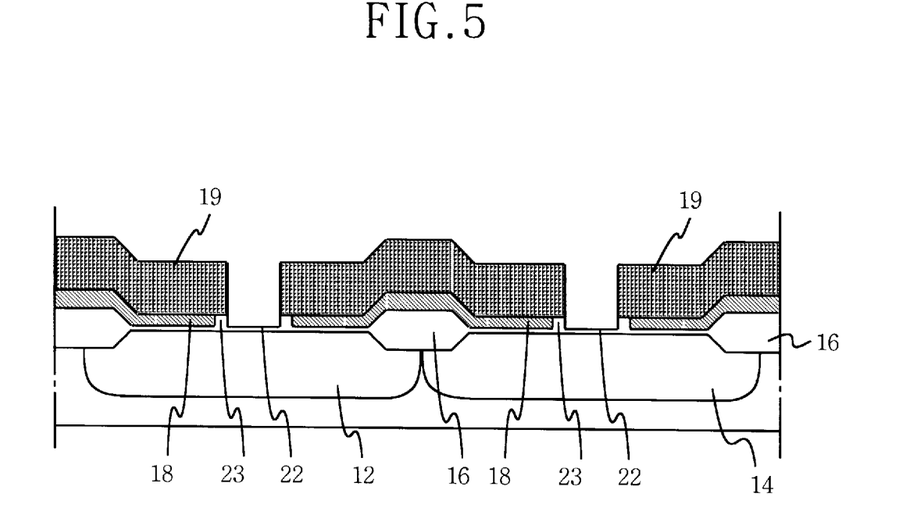
Figure 6:
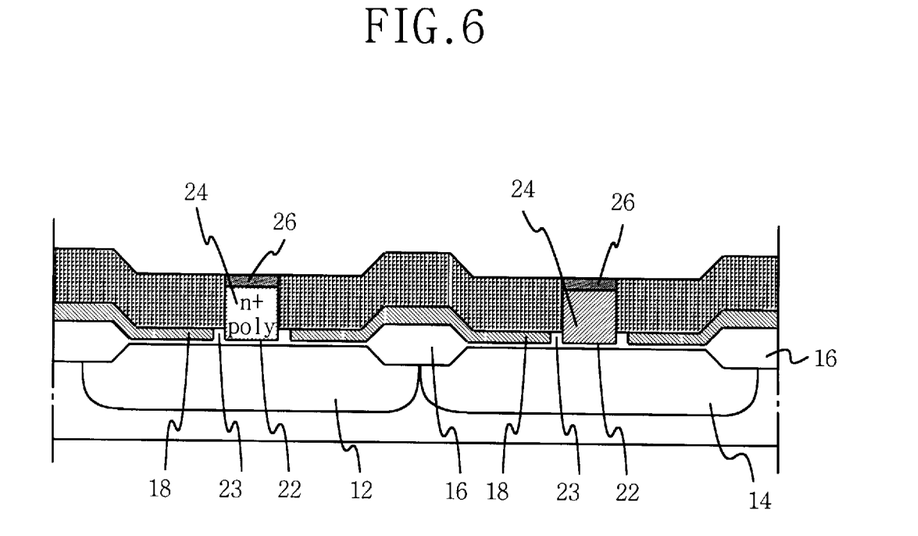

Referring now to FIG. 5, a thermal oxidation step is then preferably performed to form gate oxide layers 22 having a thicknesses of about 150–200 Å and simultaneously form first sidewalls spacers 23 having thicknesses greater than 200 Å and more preferably about 400–500 Å. In particular, the faster thermal oxidation rate of the first conductive layer 18 (e.g., intrinsic polysilicon) relative to the oxidation rate of the semiconductor substrate (e.g., monocrystalline silicon), is used advantageously to form first sidewall spacers 23 which are thicker than the gate oxide layers 22. Upon completion of the thermal oxidation step, a layer of N-type polysilicon having a thickness of about 7,000–10,000 Å is deposited into the openings in the second electrically insulating layer 19 and etched back to form N-type polysilicon gate electrodes 24 having silicide caps 26.

Figure 7:
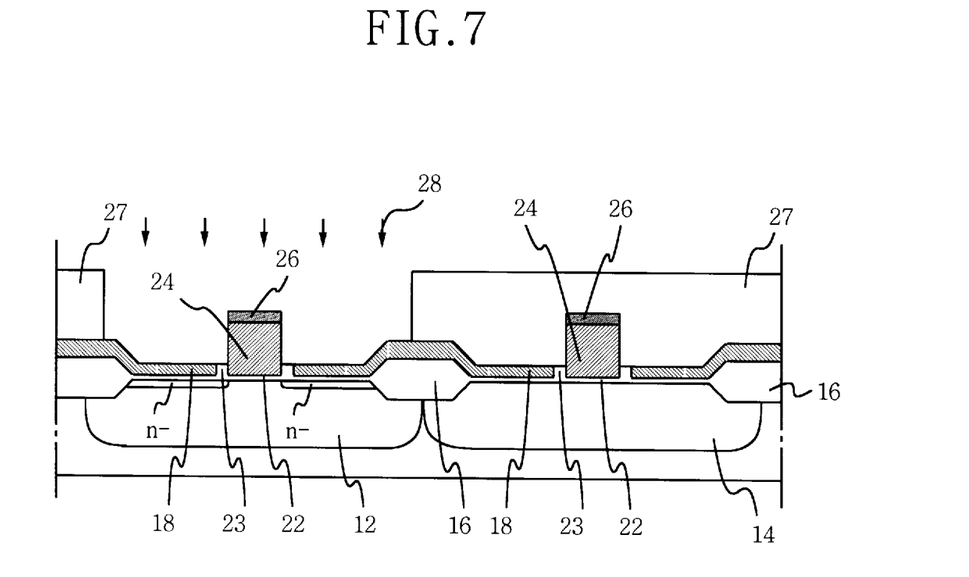
Figure 8:
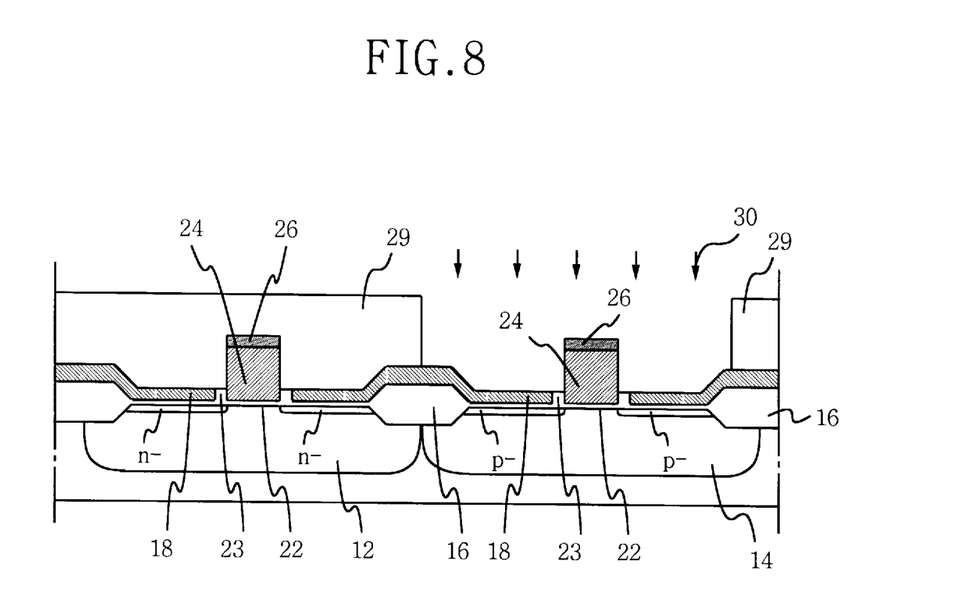

Referring now to FIG. 7, the second electrically insulating layer 19 is removed and then a first implant mask 27 is deposited and then patterned to expose a portion of the first conductive layer 18 extending opposite the P-type well region 12. Lightly doped source and drain region extensions (shown as N−) are then formed by implanting N-type dopants 28 through the first conductive layer 18 and into the P-type well region 12, using the gate 24 and silicide cap 26 of the NMOS transistor as an implant mask. Similarly, as illustrated by FIG. 8, a second implant mask 29 is deposited and patterned to expose a portion of the first conductive layer 18 extending opposite the N-type well region 14. Lightly doped source and drain region extensions (shown as P−) are then formed by implanting P-type dopants 30 through the first conductive layer 18 and into the N-type well region 14, using the gate 24 and silicide cap 26 of the PMOS transistor as an implant mask.

Figure 9:
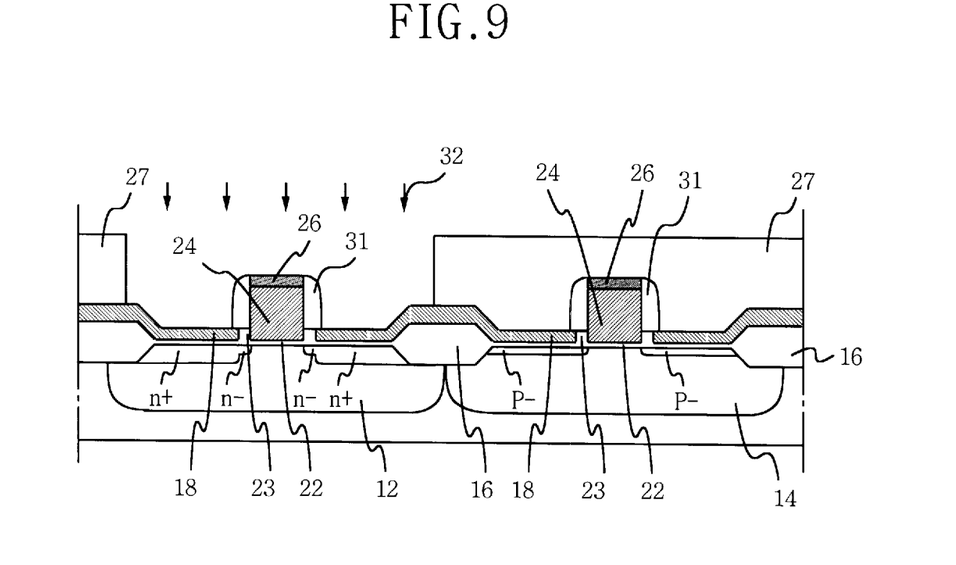
Figure 10:
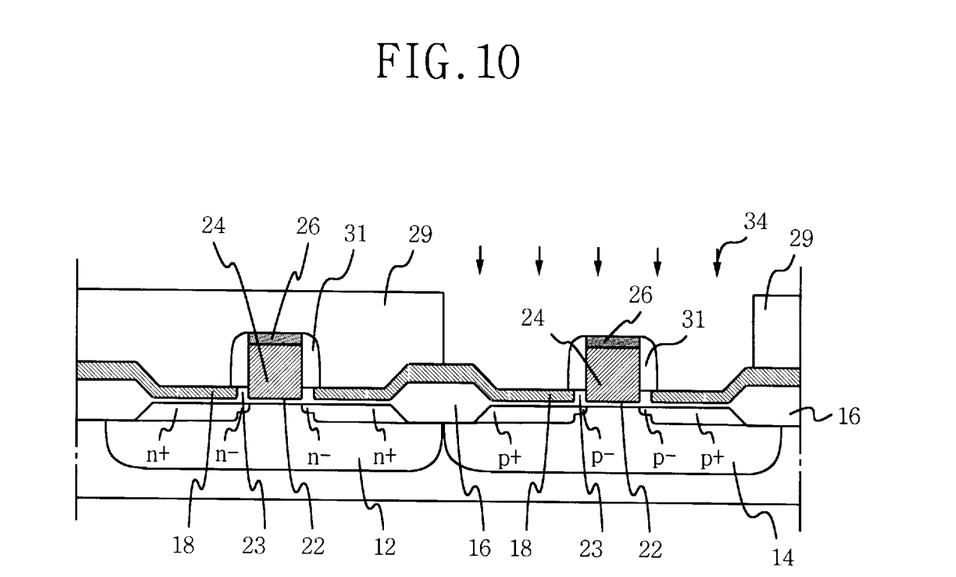
Figure 11:
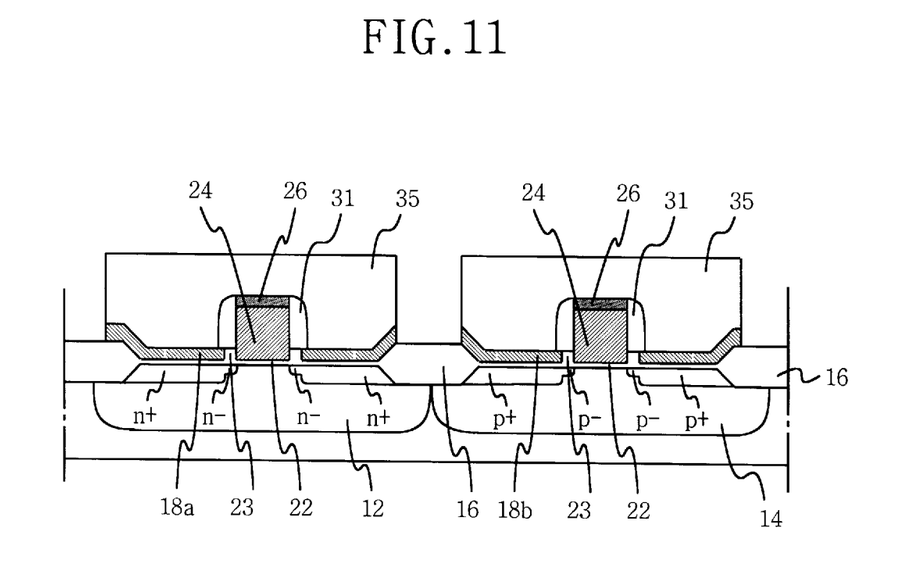

Referring now to FIG. 9, the implant mask 29 is then removed to expose the first conductive layer 18. A low temperature oxide (LTO) is then preferably deposited on the first conductive layer 18 and anisotropically etched to form second sidewalls spacers 31 on the sidewalls of the gates 24 of the NMOS and PMOS transistors. Another first implant mask 27 is then formed to cover the N-well region. N-type dopants 32 are then implanted into the lightly doped source and drain region extensions to form more highly doped source and drain regions (shown as N+), using the gate 24 of the NMOS transistor and respective spacers 31 as an implant mask. During this step, the exposed portions of the first conductive layer 18 again receive N-type dopants. As illustrated best by FIG. 10, a second implant mask 29 is patterned, and then P-type dopants 34 are implanted into the lightly doped source and drain region extensions to form more highly doped source and drain regions (shown as P+), using the gate 24 of the PMOS transistor and respective spacers 31 as an implant mask. Referring now to FIG. 11, another mask 35 is patterned and then an anisotropic dry etching step is performed to separate the first conductive layer 18 is respective N-type hot-carrier suppression electrodes 18a for the NMOS transistor and P-type hot-carrier suppression electrodes 18b for the PMOS transistor.

Referring again to FIG. 1, the mask 35 is removed and then a blanket insulating layer is deposited on the suppression electrodes 18a and 18b. Vias are then patterned through the blanket insulating layer and the suppression electrodes 18a and 18b to expose the source and drain regions of the NMOS and PMOS transistors. Metallization is then patterned in the vias to form source and drain electrodes 36a and 36b for the NMOS and PMOS transistors. As illustrated, the source and drain electrodes 36a and 36b are preferably formed so that a direct electrical connection (e.g., ohmic contact) is provided to respective suppression electrodes 18a and 18b. Thus, during operation of the NMOS and PMOS transistors, the suppression electrodes will be maintained at the same voltage potentials as the source and drain electrodes to which they are connected. As determined by the inventors herein, maintaining the suppression electrodes at the same potentials as the source and drain electrodes and regions lowers the electric fields at the ends of the channel regions and thereby inhibits hot-electron injection into the sidewall oxide and gate oxide of the NMOS and PMOS transistors.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an insulated-gate field effect transistor, comprising the steps of:

forming a first electrically insulating layer on a face of a semiconductor substrate containing a region of first conductivity type therein extending to the face;

forming a first conductive layer on the first electrically insulating layer, opposite the region of first conductivity type;

patterning the first conductive layer to define first and second hot-carrier suppression electrodes having opposing sidewalls;

oxidizing the sidewalls of the first and second hot-carrier suppression electrodes;

forming a gate electrode between the oxidized sidewalls of the first and second hot-carrier suppress electrodes;

forming source and drain regions of second conductivity type in the region of first conductivity type, opposite the first and second hot-carrier suppression electrodes, respectively; and forming a source electrode electrically connected to the first hot-carrier suppression electrode and the source region, and a drain electrode electrically connected to the second hot-carrier suppression electrode and the drain region.

2. The method of claim 1, wherein said patterning step comprises patterning the first conductive layer to define first and second hot-carrier suppression electrodes having opposing sidewalls and expose a portion of the first electrically insulating layer extending between the first and second hot-carrier suppression electrodes; and wherein said oxidizing step is preceded by the step of removing the exposed portion of the first electrically insulating layer to expose the region of first conductivity type at the face.

3. The method of claim 2, wherein said oxidizing step comprises oxidizing the exposed region of first conductivity type at a first growth rate and oxidizing the sidewalls of the first and second hot-carrier suppression electrodes at a second growth rate greater than the first growth rate, to define a gate insulating layer.

4. The method of claim 3, wherein said step of forming a gate electrode comprises forming a gate electrode on the gate insulating layer.

5. The method of claim 4, wherein said step of forming source and drain electrodes comprises forming vias in the first and second hot-carrier suppression electrodes and first electrically insulating layer to expose the source and drain regions and then patterning metallization in the vias.

6. The method of claim 4, wherein said step of forming source and drain regions comprises:

implanting dopants of second conductivity type through the first and second hot-carrier suppression electrodes, using the gate electrode as an implant mask;

forming electrically insulating spacers on sidewalls of the gate electrode; and implanting dopants of second conductivity type through the first and second hot-carrier suppression electrodes, using the gate electrode and electrically insulating spacers as an implant mask.

7. The method of claim 1, wherein said step of patterning the first conductive layer comprises patterning a mask on the first conductive layer and then isotropically etching the first conductive layer at an opening in the mask to expose a portion of the first electrically insulating layer.

8. The method of claim 7, wherein said etching step is followed by the step of etching the exposed portion of the first electrically insulating layer to expose the region of first conductivity type at the face, using the isotropically etched first conductive layer as an etching mask; and wherein said oxidizing step comprise oxidizing the isotropically etched first conductive layer and the exposed region of first conductivity type at respective different rates, using the patterned mask as an oxidation mask.

9. The method of claim 8, wherein said first conductive layer forming step comprises depositing an undoped layer of polysilicon on the first electrically insulating layer.

10. The method of claim 9, wherein said step of forming a first electrically insulating layer comprises oxidizing the region of first conductivity type at the face to form an oxide having a thickness in a range between about 150–200 Å; and wherein said step of depositing an undoped layer of polysilicon comprises depositing an undoped layer of polysilicon having a thickness in a range between about 400–500 Å.

11. The method of claim 10, wherein said oxidizing step comprises oxidizing the exposed region of first conductivity type to form an oxide having a thickness in a range between about 150–200 Å and oxidizing the isotropically etched first conductive layer to form an oxide having a thickness greater than 200 Å.

12. A method of forming a field effect transistor, comprising the steps of:

forming a first electrically insulating layer on a face of a semiconductor substrate containing a region of first conductivity type therein extending to the face;

forming first and second hot-carrier suppression electrodes having opposing sidewalls on the first electrically insulating layer;

oxidizing the opposing sidewalls of the first and second hot-carrier suppression electrodes;

forming a gate electrode between the oxidized sidewalls of the first and second hot-carrier suppression electrodes;

forming source and drain regions of second conductivity type in the region of first conductivity type; and forming a source electrode electrically connected to the first hot-carrier suppression electrode and the source region, and a drain electrode electrically connected to the second hot-carrier suppression electrode and the drain region.

13. The method of claim 12, wherein said step of forming first and second hot-carrier suppression electrodes comprises the steps of forming a first conductive layer on the first electrically insulating layer, opposite the region of first conductivity type; and then patterning the first conductive layer to define the first and second hot-carrier suppression electrodes and expose a portion of the first electrically insulating layer extending between the first and second hot-carrier suppression electrodes; and wherein said oxidizing step is preceded by the step of removing the exposed portion of the first electrically insulating layer to expose the region of first conductivity type at the face.

14. The method of claim 13, wherein said oxidizing step comprises oxidizing the exposed region of first conductivity type at a first growth rate and oxidizing the sidewalls of the first and second hot-carrier suppression electrodes at a second growth rate greater than the first growth rate, to define a gate insulating layer; and wherein said step of forming a gate electrode comprises forming a gate electrode on the gate insulating layer.

15. The method of claim 14, wherein said step of forming source and drain electrodes comprises forming vias in the first and second hot-carrier suppression electrodes and first electrically insulating layer to expose the source and drain regions and then patterning metallization in the vias.

16. The method of claim 14, wherein said step of forming source and drain regions comprises:

implanting dopants of second conductivity type through the first and second hot-carrier suppression electrodes, using the gate electrode as an implant mask;

forming electrically insulating spacers on sidewalls of the gate electrode; and implanting dopants of second conductivity type through the first and second hot-carrier suppression electrodes, using the gate electrode and electrically insulating spacers as an implant mask.

17. The method of claim 13, wherein said step of patterning the first conductive layer comprises patterning a mask on the first conductive layer and then isotropically etching the first conductive layer at an opening in the mask to expose a portion of the first electrically insulating layer.

18. The method of claim 17, wherein said etching step is followed by the step of etching the exposed portion of the first electrically insulating layer to expose the region of first conductivity type at the face, using the isotropically etched first conductive layer as an etching mask; and wherein said oxidizing step comprise oxidizing the isotropically etched first conductive layer and the exposed region of first conductivity type at respective different rates, using the patterned mask as an oxidation mask.

19. The method of claim 18, wherein said first conductive layer forming step comprises depositing an undoped layer of polysilicon having a thickness in a range between about 400–500 Å on the first electrically insulating layer; and wherein said step of forming a first electrically insulating layer comprises oxidizing the region of first conductivity type at the face to form an oxide having a thickness in a range between about 150–200 Å.

20. The method of claim 19, wherein said oxidizing step comprises oxidizing the exposed region of first conductivity type to form an oxide having a thickness in a range between about 150–200 Å and oxidizing the isotropically etched first conductive layer to form an oxide having a thickness greater than 200 Å.

* * * * *